(12) United States Patent
Isshiki et al.

(10) Patent No.: US 10,756,250 B2
(45) Date of Patent: Aug. 25, 2020

(54) PIEZOELECTRIC ELEMENT AND PIEZOELECTRIC ELEMENT APPLICATION DEVICE

(71) Applicant: Seiko Epson Corporation, Tokyo (JP)

(72) Inventors: Tetsuya Isshiki, Shiojiri (JP); Koichi Morozumi, Shiojiri (JP)

(73) Assignee: Seiko Epson Corporation (JP)

(*) Notice: Subject to any disclaimer, the term of this patent is extended or adjusted under 35 U.S.C. 154(b) by 398 days.

(21) Appl. No.: 15/801,756

(22) Filed: Nov. 2, 2017

(65) Prior Publication Data

US 2018/0138392 A1 May 17, 2018

(30) Foreign Application Priority Data

Nov. 16, 2016 (JP) .................. 2016-223531

(51) Int. Cl.
| | |
|---|---|
| H01L 41/08 | (2006.01) |
| H01L 41/04 | (2006.01) |
| H01L 41/18 | (2006.01) |
| B41J 2/16 | (2006.01) |
| H01L 41/187 | (2006.01) |
| B41J 2/14 | (2006.01) |
| H01L 41/318 | (2013.01) |
| H01L 41/09 | (2006.01) |

(52) U.S. Cl.
CPC ...... *H01L 41/0805* (2013.01); *B41J 2/14233* (2013.01); *B41J 2/161* (2013.01); *B41J 2/1623* (2013.01); *B41J 2/1628* (2013.01); *B41J 2/1629* (2013.01); *B41J 2/1631* (2013.01); *B41J 2/1635* (2013.01); *B41J 2/1642* (2013.01); *B41J 2/1646* (2013.01); *H01L 41/042* (2013.01); *H01L 41/18* (2013.01); *H01L 41/1873* (2013.01); *B41J 2/14201* (2013.01); *H01L 41/0973* (2013.01); *H01L 41/318* (2013.01)

(58) Field of Classification Search
CPC . H01L 41/0805; H01L 41/1873; H01L 41/18; H01L 41/0973; B41J 2/14201
See application file for complete search history.

(56) References Cited

U.S. PATENT DOCUMENTS

| | | | |
|---|---|---|---|
| 2003/0138372 A1* | 7/2003 | Parise | C01B 13/14 423/508 |
| 2012/0086757 A1* | 4/2012 | Kitada | B41J 2/14233 347/68 |
| 2017/0141293 A1* | 5/2017 | Kozuka | H01L 41/047 |

FOREIGN PATENT DOCUMENTS

| | | |
|---|---|---|
| JP | 2015-205805 A | 11/2015 |
| JP | 2015-205806 A | 11/2015 |

* cited by examiner

*Primary Examiner* — Bryan P Gordon
(74) *Attorney, Agent, or Firm* — Harness, Dickey & Pierce, P.L.C.

(57) ABSTRACT

A piezoelectric element includes a first electrode; a second electrode; and a piezoelectric layer arranged between the first electrode and the second electrode, in which the piezoelectric layer is a thin film that includes a perovskite-type composite oxide which includes potassium, sodium, and niobium and which is preferentially oriented in the (100) plane, and a crystal structure of the perovskite-type composite oxide includes a basic lattice structure having an oxygen octahedron and a super lattice structure in which the oxygen octahedron is tilted.

4 Claims, 8 Drawing Sheets

PIEZOELECTRIC ELEMENT AND PIEZOELECTRIC ELEMENT APPLICATION DEVICE

This application claims priority under 35 U.S.C. § 119 to Japanese Patent Application No. 2016-223531 filed on Nov. 16, 2016, the entire disclosure of which is expressly incorporated by reference herein.

BACKGROUND

1. Technical Field

The present invention relates to a piezoelectric element and a piezoelectric element application device provided with the same.

2. Related Art

In general, piezoelectric elements have a piezoelectric layer which has electro-mechanical conversion characteristics, and two electrodes with the piezoelectric layer interposed therebetween. In recent years, devices (piezoelectric element application devices) using such a piezoelectric element as a driving source have been actively developed. As piezoelectric element application devices under development, there are liquid ejecting heads which are represented by an ink jet recording head, MEMS elements which are represented by a piezoelectric MEMS element, ultrasonic measuring apparatuses which are represented by an ultrasonic sensor or the like, as well as piezoelectric actuator apparatuses, and the like.

Piezoelectric materials used for the piezoelectric layer are required to have high piezoelectric characteristics and, as such a piezoelectric material, a composite oxide (perovskite type composite oxide) having a perovskite structure of a two component system including lead titanate ($PbTiO_3$, referred to below as "PT") and zirconium oxide lead ($PbZrO_3$, referred to below as "PZ"), that is, lead zirconate titanate ($Pb(Zr,Ti)O_3$, referred to below as "PZT"), is widely known.

In recent years, there has been a demand for the development of lead-free piezoelectric material in order to eliminate the adverse effects of lead on the environment. As such a lead-free piezoelectric material, for example, potassium sodium niobate (($K,Na)NbO_3$, referred to below as "KNN") has been proposed. In addition, a method for improving the piezoelectric characteristics by adding copper (Cu), lithium (Li), tantalum (Ta), or the like to the composite oxide is disclosed (for example, in JP-A-2015-205805).

In JP-A-2015-205805, a piezoelectric element is formed using piezoelectric ceramics (bulk ceramics) formed of a mixed phase in which niobium/alkali tantalate is the main phase and different metal oxides are used as sub phases. Since such a piezoelectric element is formed of bulk ceramics, there is a problem in that it is not possible to perform alignment control. In addition, since such a piezoelectric element is formed with the main phase of niobium/alkali tantalate, voids in the bulk ceramics are filled up with the metal oxide which is a sub phase. Many elements are required for the metal oxide used for filling up the voids, thus problems also remain in terms of composition control.

SUMMARY

An advantage of some aspects of the invention is to provide a piezoelectric element and a piezoelectric element application device using a piezoelectric thin film material formed of a KNN-based composite oxide having excellent piezoelectric characteristics and for which it is possible to easily perform orientation control and composition control.

According to an aspect of the invention, there is provided a piezoelectric element including a first electrode, a second electrode, and a piezoelectric layer arranged between the first electrode and the second electrode, in which the piezoelectric layer is a thin film that includes a perovskite-type composite oxide which includes potassium, sodium, and niobium and which is preferentially oriented in a (100) plane, and a crystal structure of the perovskite-type composite oxide includes a basic lattice structure having an oxygen octahedron and a super lattice structure in which the oxygen octahedron is tilted.

In this aspect, since the piezoelectric layer is a thin film that includes a perovskite-type composite oxide which includes potassium, sodium, and niobium and which is preferentially oriented in the (100) plane and a crystal structure of the perovskite-type composite oxide includes a basic lattice structure having an oxygen octahedron and a super lattice structure in which the oxygen octahedron is tilted, it is possible to provide a piezoelectric element having excellent piezoelectric characteristics and for which it is possible to easily perform orientation control and composition control.

Here, the piezoelectric layer may be formed by interspersing regions formed of a super lattice structure in which the oxygen octahedron is tilted in a crystal structure of the perovskite-type composite oxide.

Accordingly, it is possible to improve the piezoelectric characteristics of the piezoelectric element.

According to another aspect of the invention, there is provided a piezoelectric element application device including the piezoelectric element according to any aspect above.

In this aspect, it is possible to provide a piezoelectric element application device having excellent piezoelectric characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
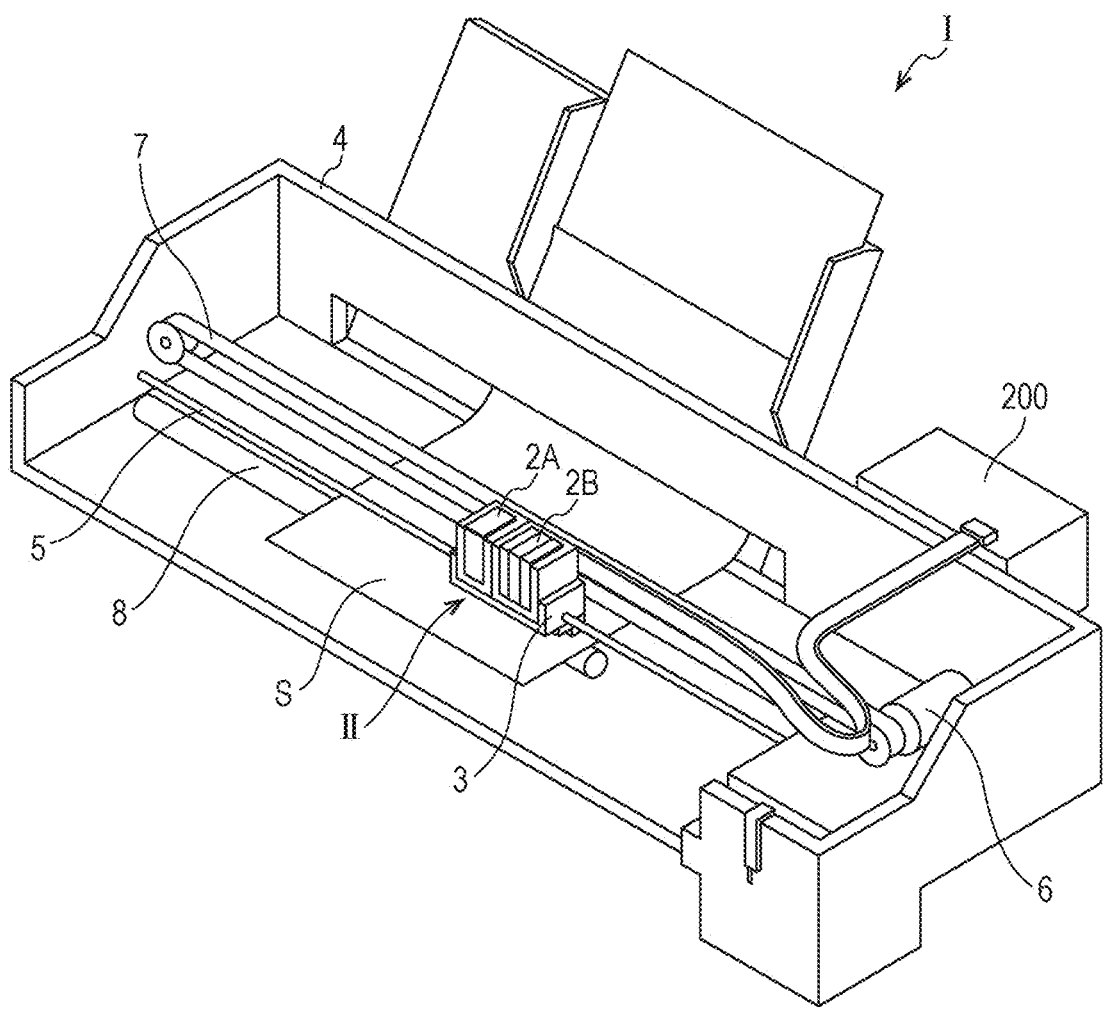
FIG. 1 is a diagram showing a schematic configuration of an ink jet recording apparatus.

A description will be given below of embodiments of the invention with reference to the drawings. The following description shows one aspect of the present invention, which is able to be optionally changed within a scope not deviating from the gist of the present invention. Here, in the drawings, the same reference numerals are attached to the same members, and explanation thereof is appropriately omitted. In addition, X, Y and Z represent three spatial axes orthogonal to each other. In the present specification, directions along these axes are defined as a first direction X (X direction), a second direction Y (Y direction), and a third direction Z (Z direction), respectively, and the direction of the arrow in each diagram will be described as a positive (+) direction and the opposite direction to the arrow will be described as a negative (−) direction. The X direction and the Y direction represent in-plane directions of the plate, layer, and film, and the Z direction represents the thickness direction or laminating direction of the plate, layer and film.

In addition, the constituent elements shown in each drawing, that is, the shape and size of each unit, the thickness of the layers, the relative positional relationship, the repeating unit, and the like may be exaggerated when describing the present invention. Furthermore, the term "above" in this specification is not intended to limit that the positional relationship of the constituent elements to "directly above". For example, the expression "the first electrode on the substrate" or "the piezoelectric layer on the first electrode" does not exclude other constituent elements being included between the substrate and the first electrode, or between the first electrode and the piezoelectric layer.

Embodiment 1

First, an ink jet recording apparatus which is an example of a liquid ejecting apparatus will be described with reference to FIG. 1.

FIG. 1 is a diagram showing a schematic configuration of an ink jet recording apparatus. As shown in the drawing, in the ink jet recording apparatus (recording apparatus I), an ink jet recording head unit (head unit II) is detachably provided in cartridges 2A and 2B. The cartridges 2A and 2B form an ink supply means. The head unit II has a plurality of ink jet recording heads (a recording head 1, refer to FIG. 2 and the like) described below, and is mounted on a carriage 3. The carriage 3 is provided movably in the axial direction on a carriage shaft 5 attached to the apparatus main body 4. The head unit II and the carriage 3 are formed to be capable of ejecting, for example, a black ink composition and a color ink composition, respectively.

The driving force of a driving motor 6 is transmitted to the carriage 3 through a plurality of gears (not shown) and a timing belt 7, and the carriage 3 on which the head unit II is mounted is moved along the carriage shaft 5. On the other hand, the apparatus main body 4 is provided with a transport roller 8 as a transport means, and a recording sheet S which is a recording medium such as paper is transported by the transport roller 8. Here, the transport means which transports the recording sheet S is not limited to being the transport roller 8 and may be a belt, a drum, or the like.

For the recording head 1, a piezoelectric element 300 according to an embodiment of the invention is used as a piezoelectric actuator apparatus, which will be described in detail later. Using the piezoelectric element 300 makes it possible to avoid deterioration of various characteristics (durability, ink ejection characteristics, and the like) in the recording apparatus I.

Next, an ink jet recording head which is an example of a liquid ejecting head mounted on a liquid ejecting apparatus will be described with reference to FIG. 2 to FIG. 4.

Figure 2:
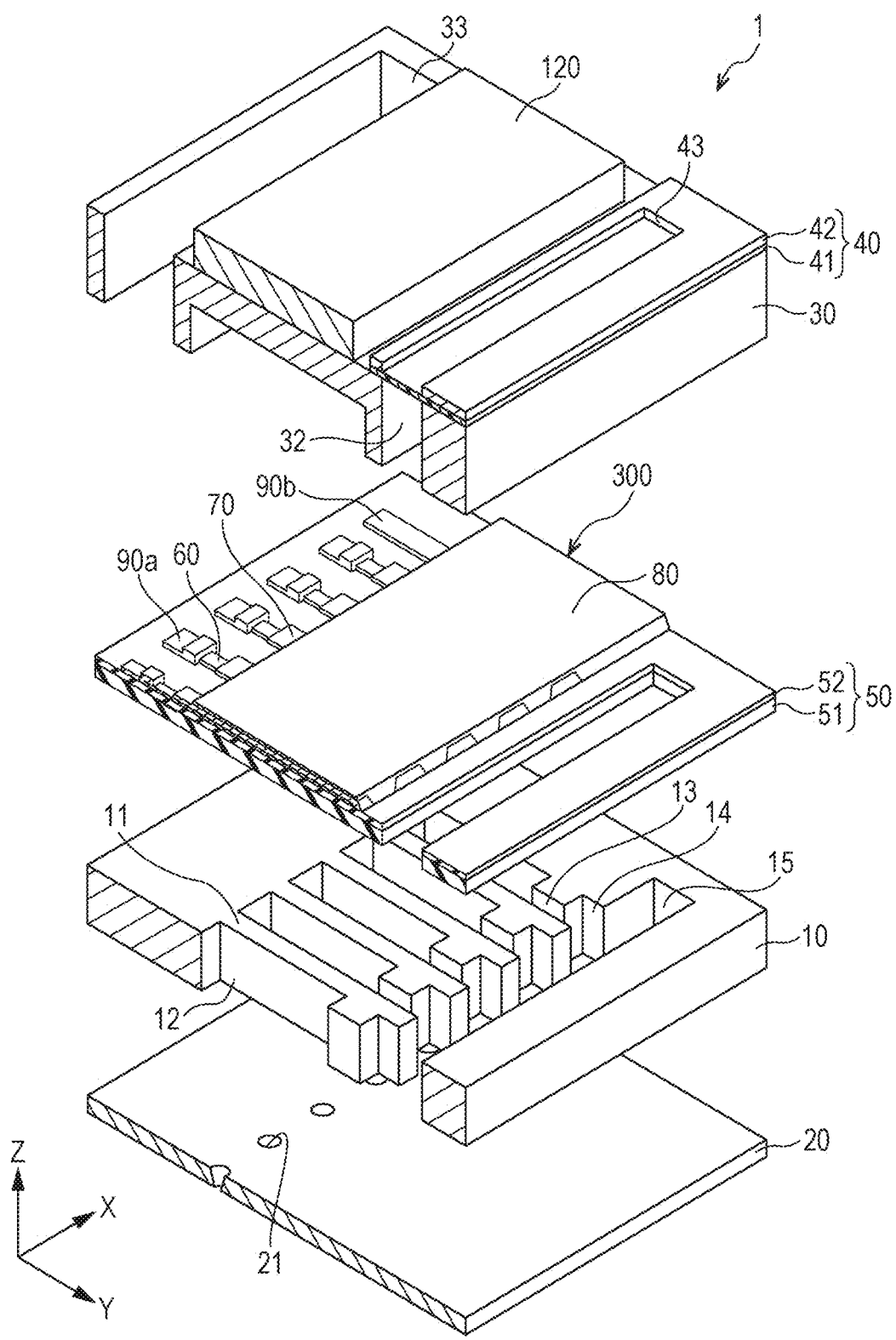
FIG. 2 is an exploded perspective view showing a schematic configuration of an ink jet recording head.
Figure 3:
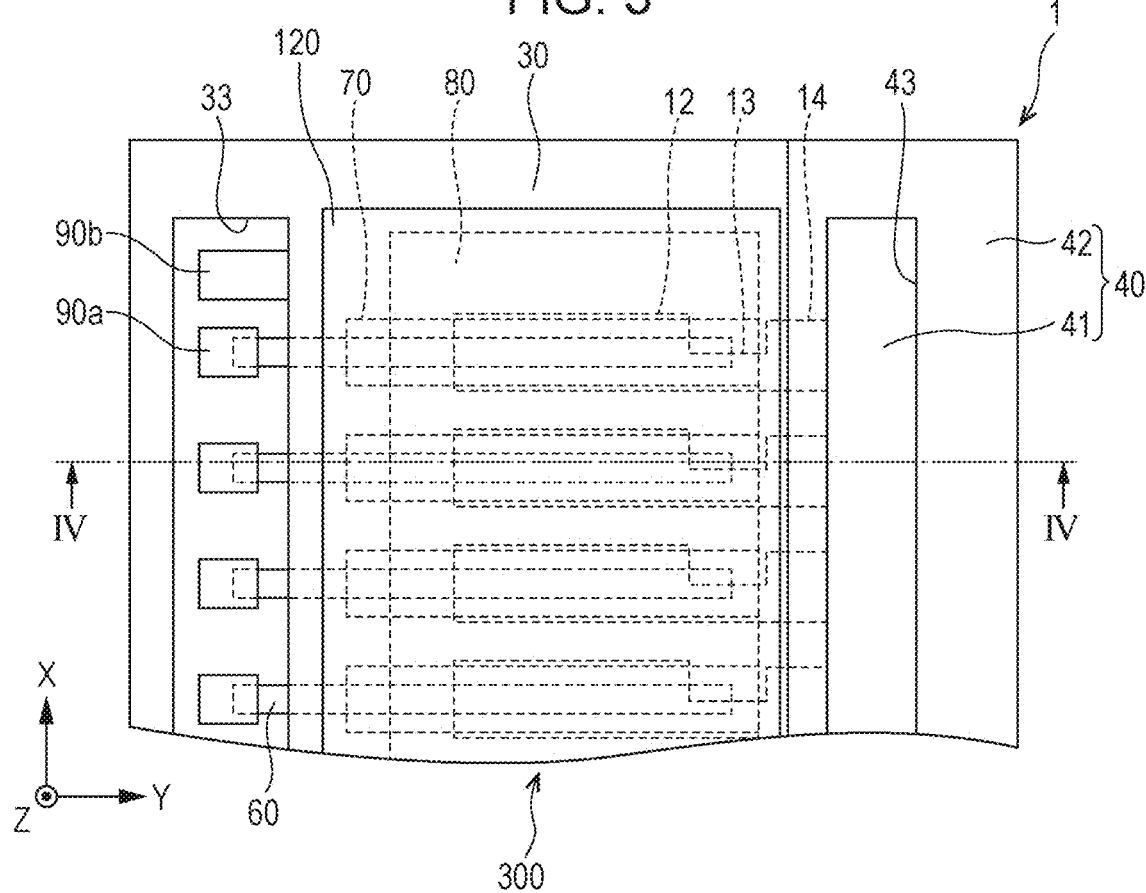
FIG. 3 is a plan view showing a schematic configuration of an ink jet recording head.

FIG. 2 is an exploded perspective view of the ink jet recording head. FIG. 3 is a plan view of the flow path forming substrate on the piezoelectric element side (a plan view of the substrate viewed from the piezoelectric element side), and FIG. 4 is a cross-sectional view taken along the IV-IV line of FIG. 3.

As shown in the diagrams, a flow path forming substrate (referred to below as "substrate 10") is formed of, for example, a silicon single crystal substrate, and a pressure-generating chamber 12 is formed. The pressure-generating chambers 12 partitioned by the plurality of partition walls 11 are lined up along a direction (X direction) in which a plurality of nozzle openings 21 for ejecting ink of the same color are provided together. The material of the substrate 10 is not limited to silicon, and may be SOI, glass, or the like.

In the substrate 10, an ink supply path 13 and a communication path 14 are formed on one end side of the pressure-generating chamber 12 in the Y direction. A communication unit 15 is formed on the outer side (the +Y direction side) of the communication path 14. The communication unit 15 forms a portion of a manifold 100. The manifold 100 forms a common ink chamber for each of the pressure-generating chambers 12. In this manner, a liquid flow path formed of the pressure-generating chambers 12, the ink supply path 13, the communication path 14, and the communication unit 15 are formed on the substrate 10.

A nozzle plate 20 made of, for example, SUS is bonded on one surface (surface on the −Z direction side) of the substrate 10. The nozzle openings 21 are provided aligned in the X direction on the nozzle plate 20. The nozzle openings 21 communicate with each pressure-generating chamber 12. The nozzle plate 20 can be bonded to the substrate 10 by an adhesive, a heat welding film, or the like.

On the other surface (the surface on the +Z direction side) of the substrate 10, a vibrating plate 50 is formed. The vibrating plate 50 is, for example, formed of an elastic film 51 formed on the substrate 10 and an insulating film 52 formed on the elastic film 51. The elastic film 51 is, for example, formed of silicon dioxide ($SiO_2$) and the insulating film 52 is, for example, formed of zirconium oxide ($ZrO_2$).

On the insulating film 52, the piezoelectric element 300 including a first electrode 60, a piezoelectric layer 70, and a second electrode 80 is formed. In addition, although not shown in FIG. 2 to FIG. 4, in order to improve the adhesion between the insulating film 52 and the first electrode 60, an adhesion layer 56 (refer to FIG. 5 to FIG. 11) is provided between the insulating film 52 and the first electrode 60. The adhesion layer 56 may be omitted.

The first electrode 60 is provided for each pressure-generating chamber 12. That is, the first electrode 60 is formed as an individual electrode independent for each pressure-generating chamber 12. The piezoelectric layer 70 is also provided for each pressure-generating chamber 12.

The second electrode 80 is provided continuously over the first electrode 60, the piezoelectric layer 70, and the vibrating plate 50 in the X direction. In other words, the second electrode 80 is formed as a common electrode. Instead of the second electrode 80, the first electrode 60 may be used as a common electrode.

The end portion on the −Y direction side of the first electrode 60 is exposed from the end portion on the −Y direction side of the piezoelectric layer 70. The end portion on the −Y direction side of the first electrode 60 is connected to a lead electrode 90a.

In addition, a lead electrode 90b is connected to the second electrode 80. It is possible to form the lead electrode 90a and the lead electrode 90b simultaneously by forming a layer of a material forming the lead electrode 90a and the lead electrode 90b over the entire surface of the substrate 10 and then patterning this layer into a predetermined shape.

On the substrate 10 on which the piezoelectric element 300 is formed, a protective substrate 30 is bonded with an adhesive 35. The protective substrate 30 has a manifold unit 32. At least a portion of the manifold 100 is formed of the manifold unit 32. The manifold unit 32 according to the present embodiment extends through the protective substrate 30 in the thickness direction (Z direction), and is further formed in the width direction (X direction) of the pressure-generating chamber 12. Then, as described above, the manifold unit 32 communicates with the communication unit 15 of the substrate 10. According to this configuration, the manifold 100 which forms a common ink chamber for each of the pressure-generating chambers 12 is formed.

Examples of the material of the protective substrate 30 include glass, a ceramic material, a metal, a resin, and the like, but it is more preferable that the protective substrate 30 is formed of a material having substantially the same thermal expansion coefficient as the substrate 10. In the present embodiment, the protective substrate 30 was formed using a silicon single crystal substrate of the same material as the substrate 10.

A compliance substrate 40 formed of a sealing film and a fixing plate 42 is bonded onto the protective substrate 30. It is possible to form the sealing film 41 of a material having low rigidity and the fixing plate 42 of a hard material such as metal. A region of the fixing plate facing the manifold 100 is an opening 43 completely removed in the thickness direction (Z direction). One surface (the surface on the +Z direction side) of the manifold 100 is sealed with only the flexible sealing film 41.

In addition, a driving circuit 120 functioning as a signal processing unit is fixed on the protective substrate 30. For the driving circuit 120, it is possible to use, for example, a circuit board or a semiconductor integrated circuit (IC). The driving circuit 120 and the lead electrode 90a are electrically connected via a connection wiring 121 formed of a conductive wire such as a bonding wire inserted through a through hole 33. It is possible to electrically connect the driving circuit 120 to a printer controller 200 (refer to FIG. 1). The driving circuit 120 functions as a control means of the actuator apparatus (the piezoelectric element 300).

Such ink jet recording heads eject ink droplets by the following operation. First, ink is taken in from an ink introduction port connected to external ink supply means (not shown), and the interior is filled with ink from the manifold 100 to the nozzle opening 21. Thereafter, a voltage is applied between the first electrode 60 and the second electrode 80 corresponding to each of the pressure-generating chambers 12 in accordance with a recording signal from a driving circuit (not shown), and the piezoelectric element 300 is bent and deformed. Then, the pressure in each pressure-generating chamber 12 is increased, and ink droplets are discharged from the nozzle opening 21.

Next, a more detailed description will be given of the piezoelectric element 300. The piezoelectric element 300 includes the first electrode 60, the second electrode 80, and the piezoelectric layer 70 provided between the first electrode 60 and the second electrode 80.

Each of the first electrode 60 and the second electrode 80 is formed to have a thickness of approximately 50 nm. However, these thicknesses are all examples and can be changed within a range not changing the gist of the invention.

The material of the first electrode 60 and the second electrode 80 is not particularly limited as long as it is a material capable of maintaining conductivity or a material which does not significantly lower conductivity even when oxidized. Examples of such materials include metal materials such as platinum (Pt), iridium (Ir), gold (Au), aluminum (Al), copper (Cu), titanium (Ti), silver (Ag), and stainless steel, tin oxide type conductive materials such as indium tin oxide (ITO) and fluorine doped tin oxide (FTC)), zinc oxide type conductive materials, oxide conductive materials such as strontium ruthenate ($SrRuO_3$), lanthanum nickelate ($LaNiO_3$), and elemental doped strontium titanate, conductive polymers, and the like.

In particular, from the viewpoint of controlling the orientation of the piezoelectric layer 70 described below, it is preferable that the material of the first electrode 60 be Pt. Although details will be described below, forming a film of Pt under a predetermined condition (for example, a film forming temperature or the like) makes it possible to preferentially orient the crystal in the (111) plane. Here, "preferential orientation" means that the proportion of crystals oriented in a predetermined plane (for example, the (111) plane) is larger than the proportion of the crystals oriented in another plane (for example, the (100) plane or (110) plane). The proportion is, for example, 60% or more, preferably 75% or more, and more preferably 80% or more.

The piezoelectric layer 70 is a thin film that includes a perovskite-type composite oxide which includes potassium (K), sodium (Na), and niobium (Nb) and which is preferentially oriented in the (100) plane. That is, the piezoelectric layer 70 in the present embodiment is a "thin film", and has a thickness of, for example, 50 nm or more and 2000 nm or less. Such a "thin film" is produced by a gas phase method, a liquid phase method, or a solid phase method (to be described below), which is clearly distinguished from so-called "bulk". The thickness of the piezoelectric layer 70 is merely an example and is able to be changed within a range not departing from the gist of the invention.

The piezoelectric layer 70 is a composite oxide with a perovskite structure including K, Na, and Nb (a so-called KNN-based composite oxide), for example, represented by General Formula $ABO_3$. That is, the piezoelectric layer includes a piezoelectric material formed of a KNN-based composite oxide represented by Formula (1).

$$(K_xNa_{1-x})NbO_3 \tag{1}$$

$(0.1 \leq X \leq 0.9)$

Since the KNN-based composite oxide represented by Formula (1) is a lead-free piezoelectric material containing a reduced amount of lead (Pb) or the like, the biocompatibility is excellent and the environmental impact is small. In addition, since the KNN-based composite oxide is excellent in piezoelectric characteristics among the lead-free piezoelectric materials, it is advantageous for improving various characteristics. In addition, since the KNN-based composite oxide has a relatively high Curie temperature and is hardly depolarized due to temperature increases in comparison with other lead-free piezoelectric materials (for example, BNT-BKT-BT; [ (Bi,Na)TiO$_3$]—[(Bi, K)TiO$_3$]—[BaTiO$_3$]), use at high temperatures is possible.

In Formula (1), the content of K is preferably 30 mol % or more to 70 mol % or less with respect to the total amount of the metal elements (K and Na) forming the A site (in other words, the content of Na is 30 mol % or more to 70 mol % or less with respect to the total amount of the metal elements forming the A site). That is, in Formula (1), it is preferable that $0.3 \leq x \leq 0.7$. Accordingly, a composite oxide having a composition with advantageous piezoelectric characteristics is formed. In addition, the content of K is more preferably 35 mol % to 55 mol % with respect to the total amount of the metal element forming the A site (in other words, the content of Na is 45 mol % to 65 mol % with respect to the total amount of the metal elements forming the A site). That is, in Formula (1), it is preferable that $0.35 \leq x \leq 0.55$. Accordingly, a composite oxide having a composition with more advantageous piezoelectric characteristics is formed.

The piezoelectric material which forms the piezoelectric layer 70 is not limited to the composition represented by Formula (1) as long as the material is a KNN-based composite oxide. For example, other metal elements (additives) may be included in the A site and B site of the potassium sodium niobate. Examples of such additives include manganese (Mn), lithium (Li), barium (Ba), calcium (Ca), strontium (Sr), zirconium (Zr), titanium (Ti), tantalum (Ta), antimony (Sb), iron (Fe), cobalt (Co), silver (Ag), magnesium (Mg), zinc (Zn), copper (Cu), lanthanum (La), samarium (Sm), cesium (Ce), aluminum (Al), and the like.

One or more of these types of additives may be included. Typically, the additive amount is 20% or less with respect to the total amount of the elements which are the main components, preferably 15% or less, and more preferably 10% or less. Using additives makes it easy to improve various characteristics so as to diversify the structure and functions, but it is preferable to have more than 80% of KNN from the viewpoint of exhibiting the characteristics derived from KNN. Here, even in a case of a composite oxide including these other elements, the composite oxide is preferably formed to have a perovskite structure represented by General Formula ABO$_3$ (ABO$_3$ type perovskite structure).

The alkali metal of the A site may be added in excess to the stoichiometric composition. In addition, the alkali metal of the A site may be lacking with respect to the stoichiometric composition. Therefore, it is also possible to represent the KNN-based composite oxide with Formula (2).

$$(K_{AX}, Na_{A(1-X)})NbO_3 \qquad (2)$$

($0.1 \leq x \leq 0.9$, preferably $0.3 \leq x \leq 0.7$)

In Formula (2), A represents the amounts of K and Na which may be added excessively, or the amounts of K and Na which may be lacking. In a case where the amounts of K and Na are excessive, $1.0 < A$. In a case where the amounts of K and Na are lacking, $A < 1.0$. For example, $A=1.1$ represents that 110 mol % of K and Na are included when the amounts of K and Na in the stoichiometric composition are 100 mol %. $A=0.9$ represents that 90 mol % of K and Na are included when the amounts of K and Na in the stoichiometric composition are 100 mol %. Here, in a case where the alkali metal of the A site is neither excessive nor lacking with respect to the stoichiometric composition, $A=1$. From the viewpoint of improvement in characteristics, $0.85 \leq A \leq 1.15$, and preferably $0.90 \leq A \leq 1.10$.

The piezoelectric material includes a material having a composition in which a portion of the element is lacking, a material having a composition in which a portion of the element is excessive, and a material having a composition in which a portion of the element is substituted with another element. As long as the fundamental characteristics of the piezoelectric layer 70 are not changed, materials which deviate from the stoichiometric composition due to the lack/excess or materials in which a portion of the element is substituted with another element are also included in the piezoelectric material according to the present embodiment.

In addition, in the present specification, the "perovskite structure composite oxide including K, Na, and Nb" is not limited only to a composite oxide with an ABO$_3$ type perovskite structure including K, Na, and Nb. That is, in this specification, "a perovskite structure composite oxide including K, Na, and Nb" includes a piezoelectric material represented by a mixed crystal including an ABO$_3$ type perovskite structure composite oxide including K, Na, and Nb (for example, the KNN-based composite oxide described above) and another composite oxide having a perovskite structure.

The other composite oxide is not limited within the scope of the invention, but is preferably a lead-free piezoelectric material not containing Pb. In addition, it is more preferable that the other composite oxide is a lead-free piezoelectric material not containing Pb and bismuth (Bi). Accordingly, the piezoelectric element 300 is excellent in biocompatibility and the environmental impact is also small.

As described above, the piezoelectric layer 70 includes a perovskite type composite oxide preferentially oriented in the (100) plane. That is, the piezoelectric layer 70 is formed of a piezoelectric material formed of the perovskite type composite oxide represented by Formula (1) or (2), in which crystals of the composite oxide are preferentially oriented in the (100) plane. It is possible for this piezoelectric material to be naturally oriented in the (100) plane without using an orientation control layer and the crystals of the piezoelectric layer 70 may be preferentially oriented in the (100) plane by other methods without departing from the gist of the invention. The crystal state of the piezoelectric layer 70 changes mainly depending on the composition ratio of the elements forming the piezoelectric body, the conditions for forming the piezoelectric layer 70 (for example, the firing temperature, the temperature rising rate upon firing, and the like), and the like. By appropriately adjusting these conditions, the crystal system of the piezoelectric layer 70 may be controlled such that a peak derived from a predetermined crystal plane is observed. When forming the piezoelectric layer 70, for example, it is preferable that the first electrode 60 to be applied be preferentially oriented in the (111) plane.

The piezoelectric layer 70 includes a basic lattice structure having an oxygen octahedron and a super lattice structure having a tilted oxygen octahedron, in the crystal structure of the perovskite type composite oxide represented by General Formula ABO$_3$. Such a crystal structure is formed, for example, by the piezoelectric layer 70 described below under predetermined conditions (for example, use of the first electrode 60 having a specific orientation, firing temperature, and the like). Here, the "super lattice structure" is a structure (tilt structure) in which the oxygen octahedron in the above-described crystal structure is inclined in a certain direction such that the period is twice the period of the basic lattice. Including the super lattice structure in the piezoelectric layer 70 makes it possible to improve the piezoelectric characteristics of the piezoelectric element including this piezoelectric layer 70.

Next, a description will be given of an example of a method for manufacturing the piezoelectric element 300 with reference to FIG. 5 to FIG. 11 together with a method for manufacturing an ink jet recording head (recording head 1). FIG. 5 to FIG. 11 are cross-sectional views for explaining a manufacturing example of the ink jet recording head.

Figure 5:
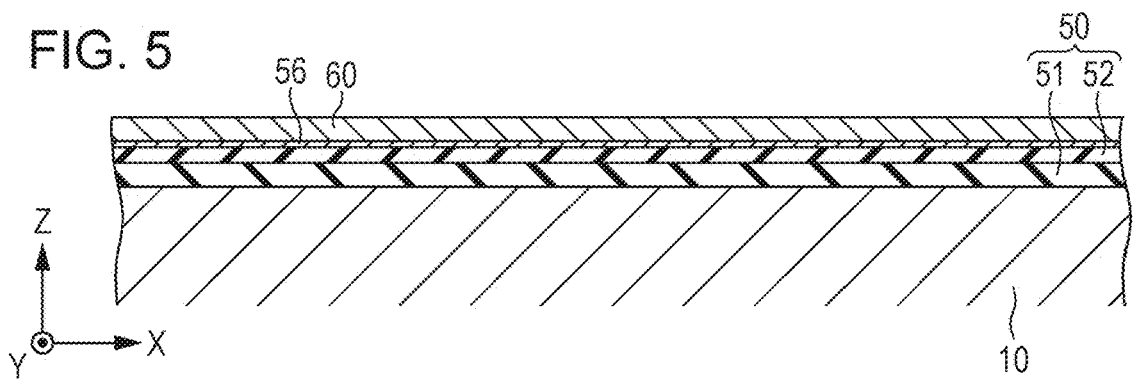
FIG. 5 is a cross-sectional view illustrating a manufacturing example of an ink jet recording head.

First, as shown in FIG. 5, a silicon substrate is prepared as the substrate 10. Next, the substrate 10 is thermally oxidized to form the elastic film 51 formed of silicon dioxide ($SiO_2$) on the surface thereof. Further, a zirconium film is formed on the elastic film 51 by a sputtering method, an evaporation method, or the like, and the insulating film 52 formed of zirconium oxide ($ZrO_2$) is obtained by thermal oxidation of the zirconium film. In this manner, the vibrating plate 50 formed of the elastic film 51 and the insulating film 52 is formed on the substrate 10.

Next, the adhesion layer 56 formed of titanium oxide ($TiO_x$) is formed on the insulating film 52. It is possible to form the adhesion layer 56 by a sputtering method, thermal oxidation, or the like. However, it is possible to omit the adhesion layer 56. Next, the first electrode 60 is formed on the adhesion layer 56. It is possible to form the first electrode 60 by vapor phase film formation such as a sputtering method, a vacuum vapor deposition method (PVD method), or a laser ablation method, liquid phase film formation such as a spin coating method, or the like. In the present embodiment, platinum (Pt) was used as the material of the first electrode 60, and formed into a film at 450° C. by a sputtering method. However, the film forming conditions in the sputtering method are not limited thereto, and the film forming temperature may be set to, for example, 200° C. to 600° C., and from the viewpoint of controlling the orientation of the piezoelectric layer 70 described below, the temperature is preferably 300° C. to 500° C. Setting the film forming temperature in such a range makes it possible to preferentially orient the Pt crystal in the (111) plane, and to form the film by preferentially orienting the piezoelectric layer 70 in the (100) plane.

Figure 6:
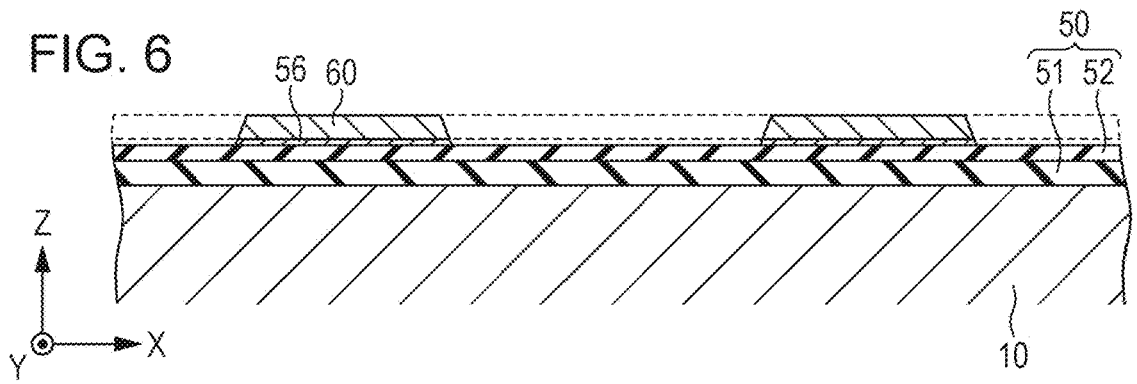
FIG. 6 is a cross-sectional view illustrating a manufacturing example of an ink jet recording head.

Next, as shown in FIG. 6, the adhesion layer 56 and the first electrode 60 are simultaneously patterned. It is possible to perform the patterning of the adhesion layer 56 and the first electrode 60 by dry etching such as reactive ion etching (RIE), ion milling or the like, or wet etching using an etching solution. The shape of the adhesion layer and the first electrode 60 in the patterning is not particularly limited.

Figure 7:
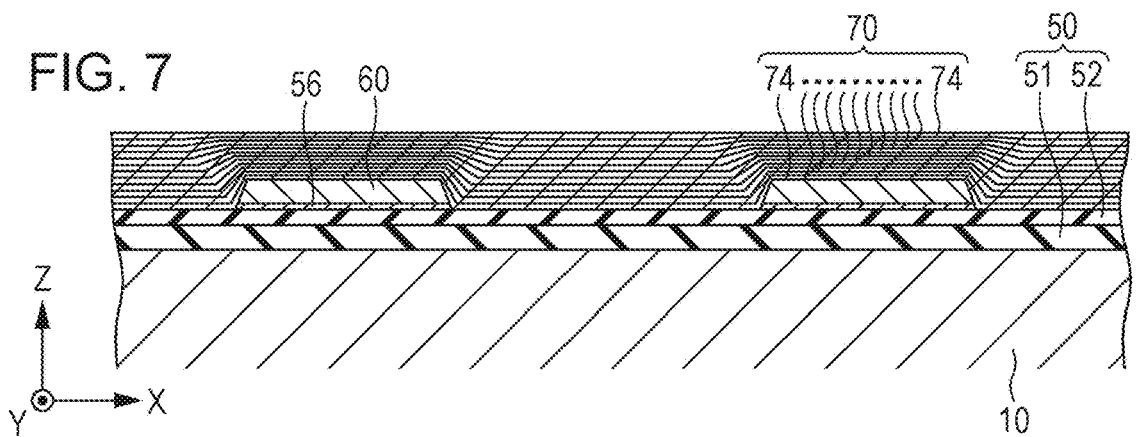
FIG. 7 is a cross-sectional view illustrating a manufacturing example of an ink jet recording head.

Next, as shown in FIG. 7, the piezoelectric layer 70 is formed. The method of forming the piezoelectric layer is not limited. For example, it is possible to use a chemical solution method (wet method) such as a Metal-Organic Decomposition (MOD) method in which a solution including a metal complex (precursor solution) is coated and dried and then fired at a higher temperature to obtain a metal oxide, or a sol-gel method. In addition, it is possible to manufacture the piezoelectric layer 70 using a vapor phase method, a liquid phase method, or a solid phase method such as a laser ablation method, a sputtering method, a pulse laser deposition method (PLD method), a chemical vapor deposition (CVD) method, or an aerosol deposition method.

For example, although the piezoelectric layer 70 formed by the wet method will be described in detail later, it is preferable to have a plurality of piezoelectric films 74 formed by a series of steps form a step (coating step) of coating the precursor solution to form the precursor film, a step (drying step) of drying the precursor film, a step (degreasing step) of degreasing the dried precursor film by heating, and a step (firing step) of firing the degreased precursor film. That is, the piezoelectric layer 70 is formed by repeating a series of steps from the coating step to the firing step a plurality of times. In the series of steps described above, the firing step may be carried out after repeating from the coating step to the degreasing step a plurality of times.

Layers and films formed by a wet method have an interface. In the layers or films formed by the wet method, traces of the coating or firing remain, and such traces form "interfaces" which are able to be confirmed by observation of the cross-section or analysis of the concentration distribution of elements in the layer (or in the film). "Interface" strictly means a boundary between layers or between films, but here has the meaning of near the boundary of a layer or film. In a case of observing the cross-section of the layer or film formed by a wet method, such an interface is confirmed in the vicinity of the boundary between the adjacent layers or films, as a portion having a thicker color than other parts or a portion having a thinner color than other parts. In addition, in a case of analyzing the concentration distribution of elements, such an interface is confirmed as a portion where the concentration of the element is higher than the other parts, or a portion where the concentration of the element is lower than the other parts in the vicinity of the boundary with the adjacent layer or film. The piezoelectric layer 70 is formed (formed of a plurality of piezoelectric films 74) by repeating a series of steps from the coating step to the firing step a plurality of times, or by repeating the steps from the coating step to the degreasing step a plurality of times and then performing a firing step, thus there are a plurality of interfaces corresponding to each piezoelectric film 74.

An example of a specific procedure in a case where the piezoelectric layer 70 is formed by a wet method is as follows. First, a precursor solution formed of a MOD solution or sol including a metal complex and for forming the piezoelectric layer 70 is prepared (preparation step). Then, this precursor solution is coated onto the patterned first electrode 60 using a spin coating method or the like to form a precursor film (coating step). Next, the precursor film is heated to a predetermined temperature, for example, approximately 130° C. to 250° C. and dried for a certain period of time (drying step), and the dried precursor film is degreased by being further heated to a predetermined temperature, for example, approximately 300° C. to 450° C. and held for a certain period of time (degreasing step). Furthermore, the degreased precursor film is heated to a higher temperature, for example, approximately 600° C. to 800° C., and held at this temperature for a certain period of time to crystallize and form a piezoelectric film 74 (firing step). Then, the above-described coating step, drying step, degreasing step, and firing step are repeated a plurality of times to form the piezoelectric layer 70 formed of the plurality of layers of piezoelectric films 74 shown in FIG. 7.

In the present embodiment, a plurality of layers of the piezoelectric film 74 are formed by repeating from the coating step and the firing step a plurality of times, and then the piezoelectric layer 70 is formed by further firing the plurality of layers of the piezoelectric films 74. More specifically, in a firing step of forming the piezoelectric film 74, firing is performed at a low temperature (for example, approximately 600° C. to 700° C.) and, in a firing step of forming the piezoelectric layer 70 formed of a plurality of layers of piezoelectric films 74, firing is performed at a high temperature (for example, approximately 700° C. to 800° C.)

Performing the firing in two stages in this manner makes it possible to form the piezoelectric layer 70 to be preferentially oriented in the (100) plane. Furthermore, carrying out the firing steps described above makes it possible to control the orientation of the piezoelectric layer 70 and makes it possible for the perovskite structure in the composite oxide forming the piezoelectric layer 70 to include a super lattice structure in which the period is twice the period of the basic lattice. Due to this, it is possible to improve the piezoelectric characteristics of the piezoelectric element including the piezoelectric layer 70.

The precursor solution described above is obtained by dissolving or dispersing a metal complex capable of forming the perovskite type composite oxide represented by Formula (1) or Formula (2) described above by firing, in an organic solvent, respectively. That is, the precursor solution includes each element of K, Na, and Nb as the main metal of the metal complex. At this time, a metal complex including an element other than the above elements, for example, a metal complex including an additive of Mn, Li, Ba, Ca, Sr, Zr, Ti, Ta, Sb, Fe, Co, Ag, Mg, Zn, Cu, La, Sm, Ce, Al, or the like may be further mixed in the precursor solution.

As the metal complex including each of the elements described above, it is possible to use for example, an alkoxide, an organic acid salt, a β-diketone complex, or the like. In the precursor solution, the mixing ratio of these metal complexes may be such that K, Na, and Nb included in the perovskite type composite oxide have a desired molar ratio.

Examples of the metal complex including K used for preparing the precursor solution include potassium 2-ethylhexanoate, potassium acetate, and the like. Examples of the metal complex including Na include sodium 2-ethylhexanoate, sodium acetate, and the like. Examples of metal complexes including Nb include niobium 2-ethylhexanoate, pentaethoxy niobium, and the like. For example, in a case where Mn is added as an additive, examples of a metal complex containing Mn include manganese 2-ethylhexanoate and the like. At this time, two or more types of metal complexes may be used in combination. For example, potassium 2-ethylhexanoate and potassium acetate may be used in combination as a metal complex including K.

Examples of the organic solvent used for preparing the precursor solution include propanol, butanol, pentanol, hexanol, octanol, ethylene glycol, propylene glycol, octane, decane, cyclohexane, xylene, toluene, tetrahydrofuran, acetic acid, octylic acid, 2-n-butoxyethanol, n-octane, and the like, mixed solvents thereof, and the like.

The precursor solution may include additives which stabilize the dispersion of metal complexes including K, Na, and Nb. Examples of such additives include 2-ethylhexanoic acid and the like.

Examples of the heating apparatus used in the drying step, the degreasing step, and the firing step include a Rapid Thermal Annealing (RTA) apparatus which heats by irradiation with an infrared lamp, a hot plate, or the like.

Figure 8:
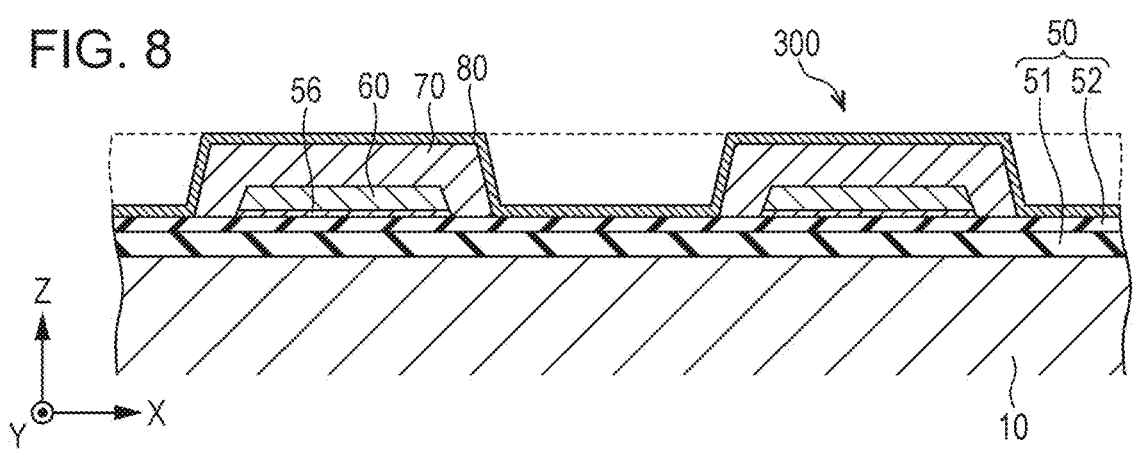
FIG. 8 is a cross-sectional view illustrating a manufacturing example of an ink jet recording head.

Next, as shown in FIG. 8, the piezoelectric layer formed of the plurality of piezoelectric films 74 is patterned. it is possible to perform the patterning by so-called dry etching such as reactive ion etching or ion milling or wet etching using an etching solution. The shape of the piezoelectric layer 70 in the patterning is not particularly limited. Subsequently, the second electrode 80 is formed on the patterned piezoelectric layer 70. it is possible to form the second electrode 80 by the same method as the first electrode 60.

Here, a reheating treatment (post annealing) may be performed before and after forming the second electrode 80 on the piezoelectric layer 70 in a temperature range of approximately 600° C. to 800° C. as necessary. Performing post-annealing in this manner makes it possible to form a favorable interface between the piezoelectric layer 70 and the first electrode 60 or the second electrode 80 and to improve the crystallinity of the piezoelectric layer 70.

Through the above steps, the piezoelectric element 300 provided with the first electrode 60, the piezoelectric layer 70, and the second electrode 80 is completed. In other words, a portion where the first electrode 60, the piezoelectric layer 70, and the second electrode 80 overlap is the piezoelectric element 300.

Figure 4:
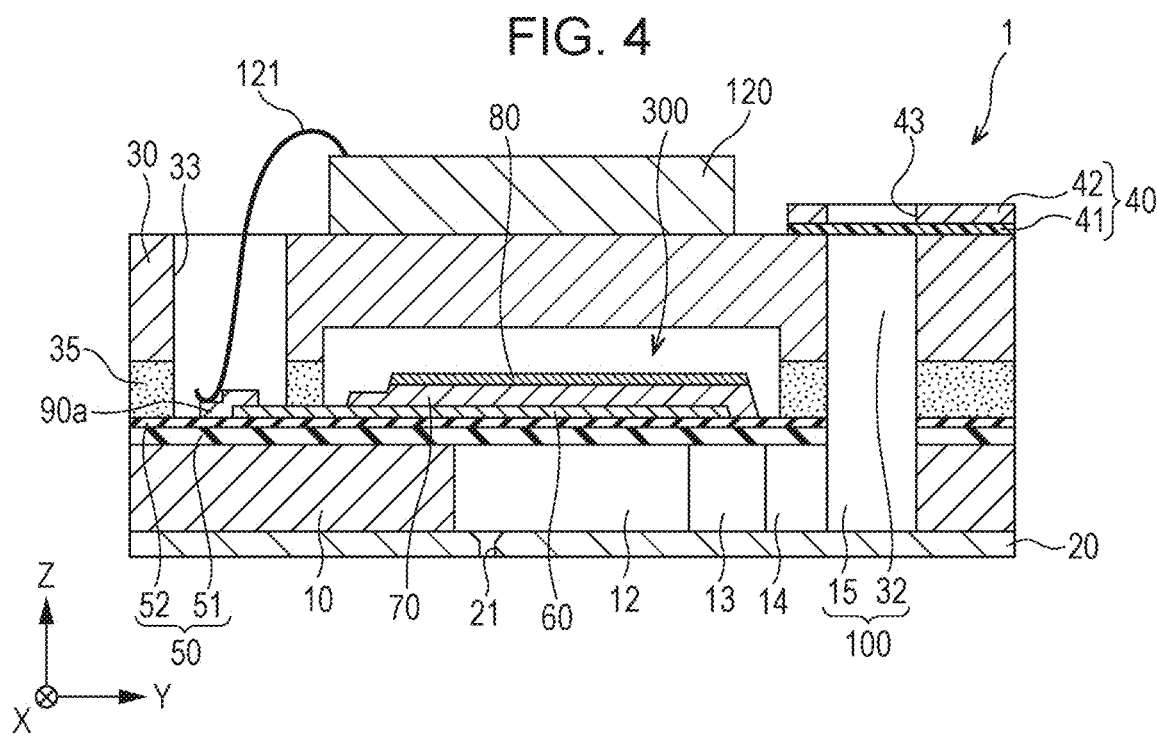
FIG. 4 is a cross-sectional view showing a schematic configuration of an ink jet recording head.
Figure 9:
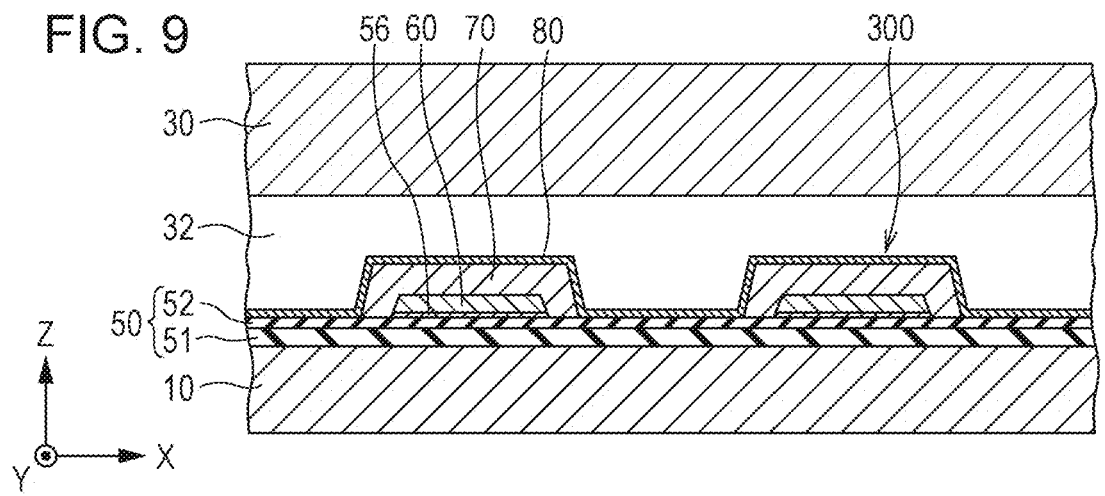
FIG. 9 is a cross-sectional view illustrating a manufacturing example of an ink jet recording head.

Next, as shown in FIG. 9, the protective substrate 30 is bonded as a protective substrate wafer to the surface of the substrate 10 on the piezoelectric element 300 side via the adhesive 35 (refer to FIG. 4). After that, the surface of the protective substrate 30 is thinned by abrasion. In addition, the manifold unit 32 and the through hole 33 (refer to FIG. 2 to FIG. 4) are formed in the protective substrate 30.

Figure 10:
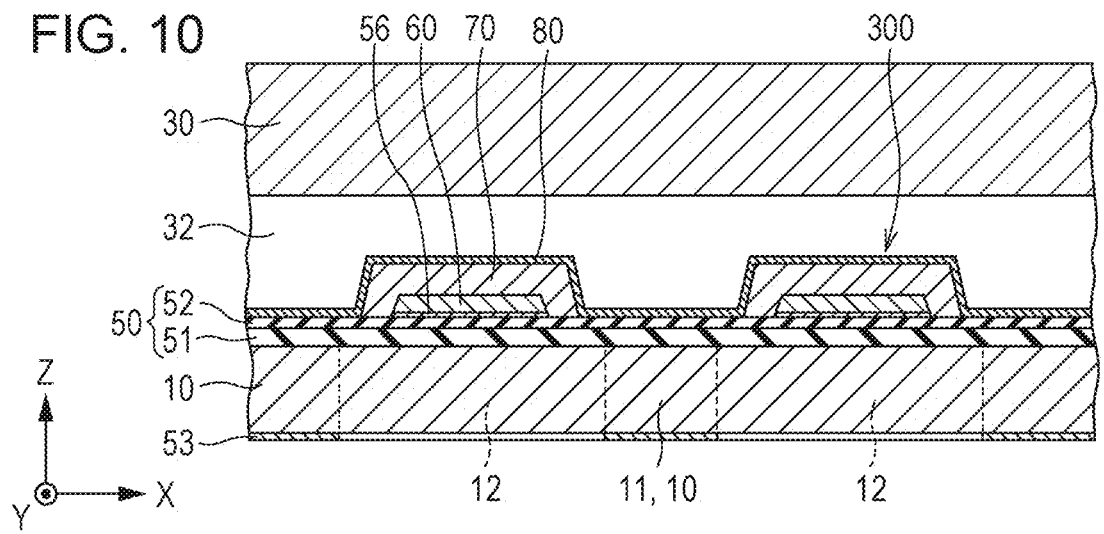
FIG. 10 is a cross-sectional view illustrating a manufacturing example of an ink jet recording head.
Figure 11:
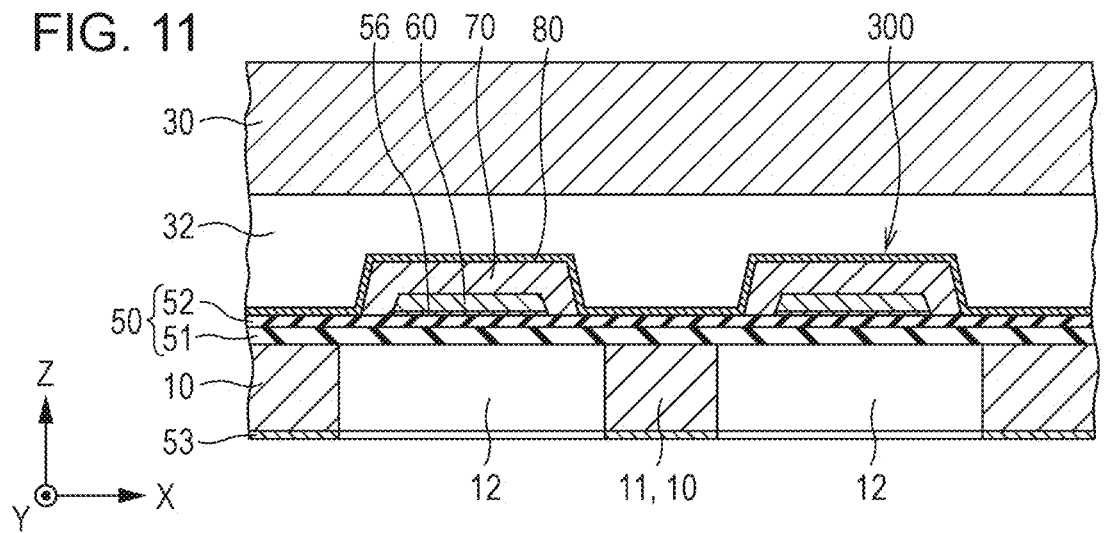
FIG. 11 is a cross-sectional view illustrating a manufacturing example of an ink jet recording head.

Next, as shown in FIG. 10, a mask film 53 is formed on the surface of the substrate 10 opposite to the piezoelectric element 300, and is patterned into a predetermined shape. Then, as shown in FIG. 11, anisotropic etching (wet etching) using an alkali solution such as KOH is carried out on the substrate 10 via the mask film 53 such that the substrate 10 is divided by the plurality of partition walls 11 to form the pressure-generating chambers 12. Furthermore, in addition to the pressure-generating chambers 12 corresponding to the individual piezoelectric elements 300, the ink supply path 13, the communication path 14, and the communication unit 15 (refer to FIG. 2 to FIG. 4) are formed.

Next, unnecessary portions of the outer peripheral edge portions of the substrate 10 and the protective substrate 30 are cut and removed by dicing or the like. Furthermore, the nozzle plate 20 is bonded to the surface of the substrate 10 opposite to the piezoelectric element 300 (refer to FIG. 2 and FIG. 4). In addition, the compliance substrate 40 is bonded to the protective substrate 30 (refer to FIG. 2 and FIG. 4). Through the steps so far, an aggregate of the chips of the recording head 1 is completed. The recording head 1 is obtained by dividing this aggregate into individual chips (refer to FIG. 2 and FIG. 4).

EXAMPLES

A more detailed description will be given below of the invention with reference to examples. The invention is not limited to the following examples.

Preparation of Sample 1

First, by thermally oxidizing a 6-inch, (100) plane single crystal silicon (Si) substrate (the substrate 10), a silicon oxide ($SiO_2$) film (elastic film 51) having a film thickness of 1200 nm was formed on the surface of the Si substrate. A zirconium film was formed on the $SiO_2$ film by a sputtering method and the zirconium film was thermally oxidized to form a zirconium oxide ($ZnO_2$) film (insulating film 52) with a film thickness of 400 nm. Next, a titanium film having a film thickness of 40 nm was produced on the $ZnO_2$ film by a RF magnetron sputtering method, and the titanium film was thermally oxidized to produce a titanium oxide ($TiO_x$) film (adhesion layer 56). Next, a platinum (Pt) film oriented in the (111) plane and having a thickness of 100 nm was formed on the $TiO_x$ film by RF magnetron sputtering. Here, the Pt film was formed at 450° C. Next, a pattern having a predetermined shape was formed on the Pt film by photolithography, and the $TiO_x$ film and the Pt film were patterned by dry etching to form a first electrode (first electrode 60).

Next, a 2-n-butoxyethanol solution of potassium acetate, an n-octane solution of sodium acetate, and a 2-n-ethylhexanoic acid solution of pentaethoxy niobium were mixed to prepare a precursor solution with a sol concentration (metallic element concentration) of 0.6 M/L (K/Na=0.4/0.6) (preparation step). Next, the prepared precursor solution was coated onto the Si substrate having the first electrode formed thereon by a spin coating method at 1500 rpm to 3000 rpm (coating step). Next, the Si substrate was placed on a hot plate and dried at 180° C. for 5 minutes (drying step). Next, the Si substrate was degreased at 350° C. for 10 minutes on a hot plate (degreasing step). Next, the Si substrate was fired at 600° C. for 3 minutes by an RTA apparatus (firing step). Then, a KNN film (piezoelectric film 74) having a thickness of 70 nm was formed. Subsequently, after repeating from the coating step to the firing step described above 8 times, firing was performed at 700° C. using an electric furnace to form a perovskite type composite oxide layer (piezoelectric layer 70). The composition ratio of each metal prepared with the precursor solution and the composition ratio of the perovskite type composite oxide layer (referred to below as "KNN oxide layer") hardly deviated from each other.

Next, an iridium (Ir) film having a film thickness of 50 nm was formed on the KNN oxide layer by a sputtering method. Next, a predetermined shape pattern was formed on the Ir film by photolithography, and the KNN oxide layer and the Ir film were patterned by dry etching to form a second electrode (second electrode 80).

Next, the surface oxide film was removed by a grinding treatment on the surface of the Si substrate opposite to the surface on which each of the electrodes and the KNN oxide layer were formed. Next, a Cr hard mask (mask film 53) was formed by forming a chromium (Cr) film of a predetermined shape on the ground surface from which the surface oxide film was removed. Next, after applying a waterproof treatment to the surface on which each electrode and the KNN oxide layer were formed, the substrate was immersed in an etching solution containing KOH, whereby a piezoelectric element (piezoelectric element 300) having a cavity (CAV) structure having a predetermined shape (pressure-generating chamber 12) described above was prepared on the ground surface and used as Sample 1.

Preparation of Samples 2 to 4

A piezoelectric element was prepared in the same manner as in Sample 1 except for repeating a series of steps from a coating step through a degreasing step and firing for minutes at 700° C. to 750° C. using an RTA apparatus eight times to form a KNN oxide layer and this was used as Sample 2.

In addition, piezoelectric elements were prepared in the same manner as in Sample 1 except that Pt films were formed at 200° C. and room temperature (25° C.), respectively, and the KNN oxide layer was formed, and these were used as Sample 3 and Sample 4.

Structure Analysis of Piezoelectric Element

Figure 12:
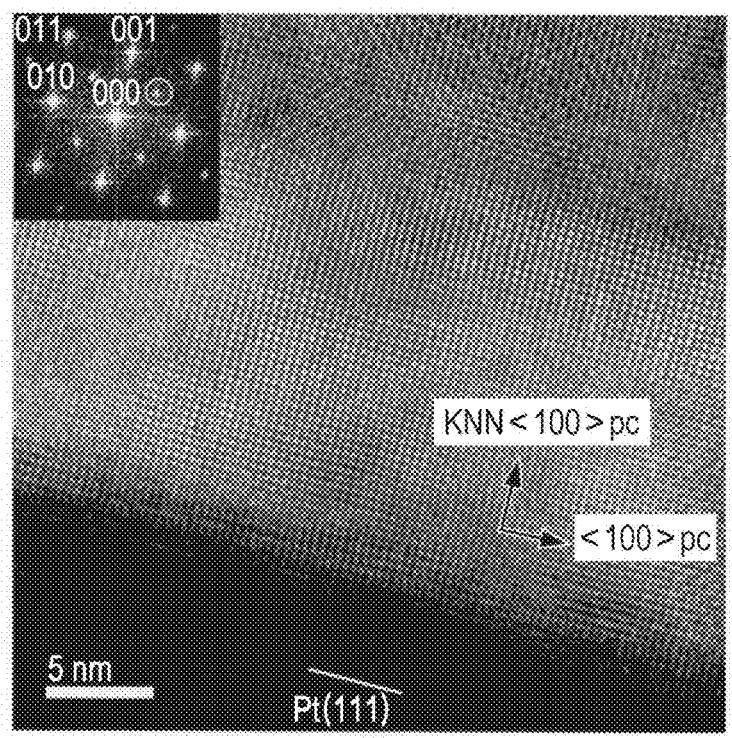
FIG. 12 is a diagram showing a TEM image and a diffraction pattern of Sample 1.
Figure 13:
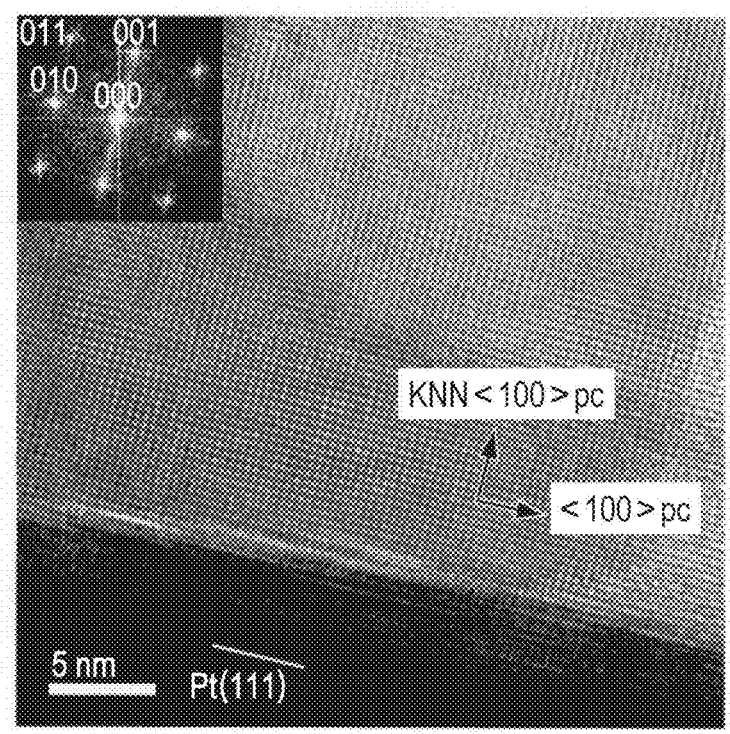
FIG. 13 is a diagram showing a TEM image and a diffraction pattern of Sample 2.

FIG. 12 and FIG. 13 show the observation results (TEM image) of the spatial distribution of electron beam transmittance of Samples 1 and 2 obtained using a transmission electron microscope (TEM), respectively. In addition, similarly, an interference image (diffraction pattern) resulting from electron beam diffraction is shown in the upper left frame of FIG. 12 and FIG. 13, respectively. As shown in FIG. 12 and FIG. 13, in Sample 1, the reflection of the diffraction grating corresponding to the (100) plane and the reflection of the super lattice corresponding to the (½) (110) plane were confirmed in the KNN oxide layer; however, in Sample 2, only the reflection of the diffraction grating corresponding to the (100) plane was confirmed.

Figure 14:
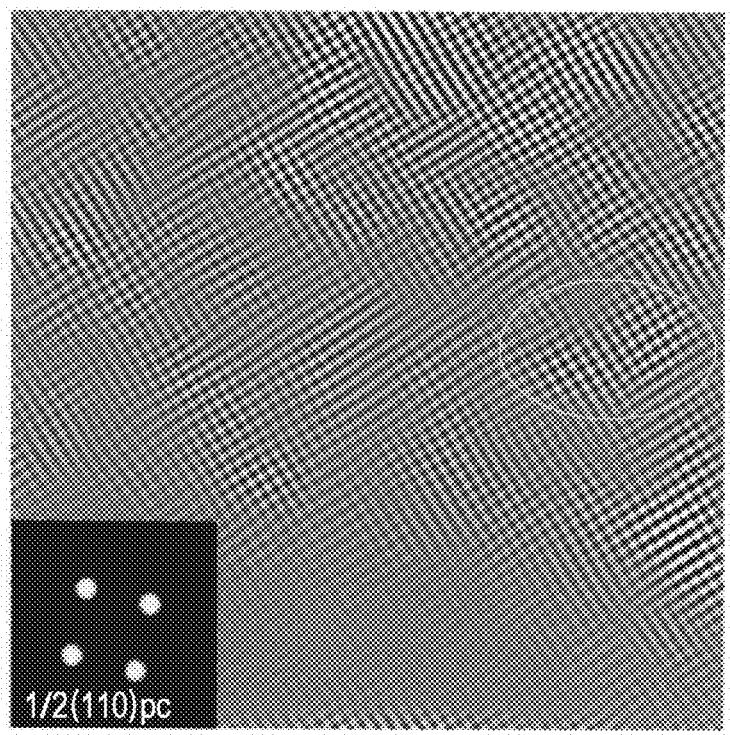
FIG. 14 is a diagram showing an IFFT image of Sample 1 and a partial enlarged view thereof.

Furthermore, FIG. 14 shows the result (IFFT image) of image processing (Inverse Fast Fourier Transformation (IFFT)) performed on the TEM image (FIG. 12). In addition, a partial enlarged view of the IFFT image is shown in the lower left frame of FIG. 14. As shown in FIG. 14, in Sample 1, it was confirmed that the super lattice structure was scattered in the form of domains in the KNN oxide layer.

Measurement of Relative Dielectric Constant of Piezoelectric Element

Figure 15:
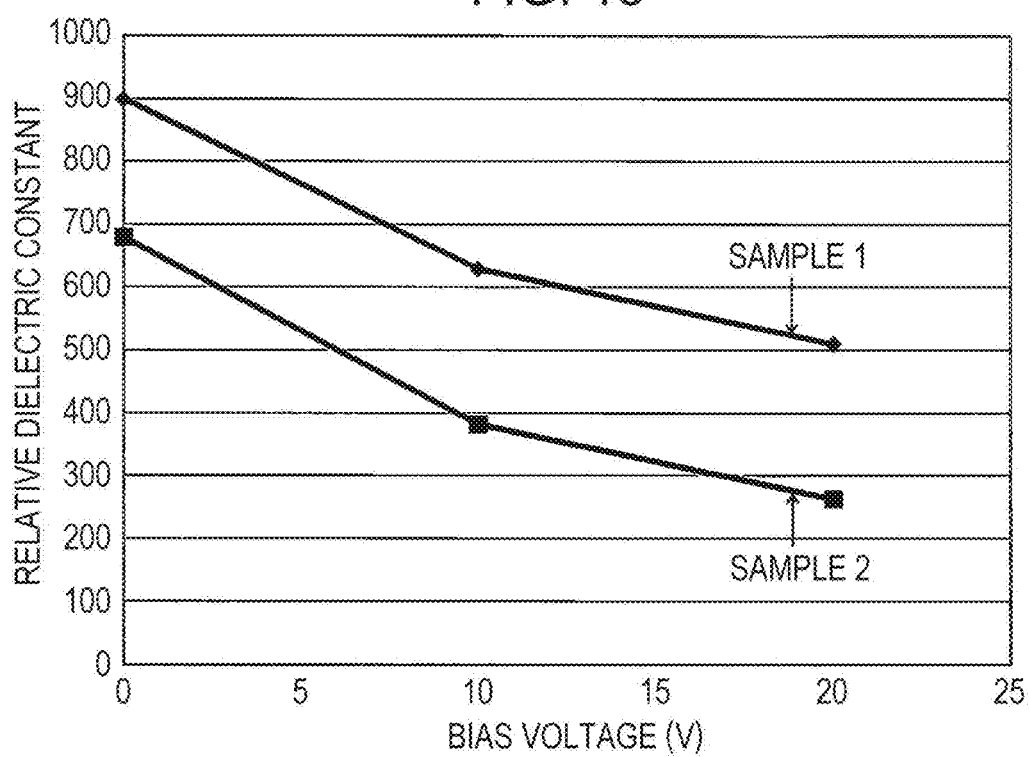
FIG. 15 is a diagram showing the relative dielectric constant comparison results of Samples 1 and 2.

The relative dielectric constants of Samples 1 and 2 thus obtained were measured, and the results of comparing these are shown in FIG. 15. As shown in FIG. 15, it was confirmed that Sample 1 exhibited a higher dielectric constant than Sample 2.

From the above results, in Sample 1, the KNN oxide layer, in which the perovskite structure having an oxygen octahedron and the perovskite structure having a super lattice structure having an oxygen octahedron tilted coexist, is formed of (K, Na) $NbO_3$ and preferentially oriented in the (100) plane. It was found that the Sample 1 having such a configuration exhibits a high dielectric constant, that is, excellent piezoelectric characteristics, as compared with the Sample 2 which does not have such a configuration.

Crystallinity Evaluation of Piezoelectric Element

Figure 16:
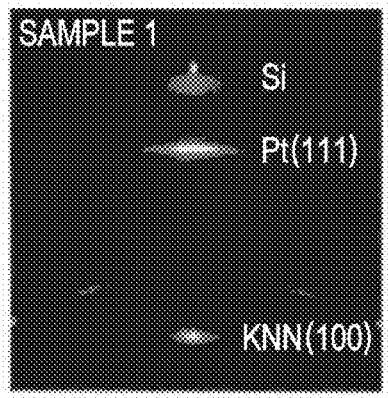
FIG. 16 is a diagram showing an X-ray two-dimensional map of Sample 1.
Figure 17:
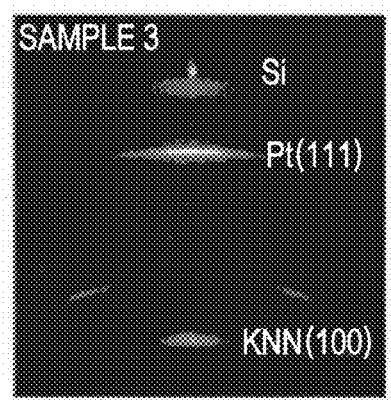
FIG. 17 is a diagram showing an X-ray two-dimensional map of Sample 3.
Figure 18:
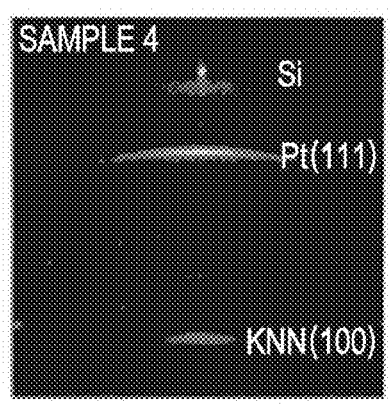
FIG. 18 is a diagram showing an X-ray two-dimensional map of Sample 4.

With respect to the obtained Sample 1, Sample 3, and Sample 4, using a two-dimensional detector for X-ray crystal structure analysis (X-ray diffraction (XRD) method), X-ray two-dimensional maps visualizing the orientations (spots) of each of the crystals are shown in FIG. 16 to FIG. 18, respectively. As shown in FIG. 16 to FIG. 18, in comparison with Sample 3 (200° C.) and Sample 4 (room temperature), it was confirmed that, in the Sample 1 (film forming temperature of Pt 450° C.), the first electrode was highly oriented in the (111) plane and the KNN oxide layer was highly oriented in the (100) plane. As described above, the Sample 1 has a KNN oxide layer in which a perovskite structure having an oxygen octahedron and a perovskite structure having a super lattice structure having a tilted oxygen octahedron coexist, thus, although the details are unknown, it was suggested that the first electrode highly oriented in the (111) plane was involved in the formation of the super lattice structure in the KNN oxide layer.

Other Embodiments

In the first embodiment, the liquid ejecting head mounted in the liquid ejecting apparatus is described as an example of the piezoelectric element application device, but the scope of application of the invention is not limited thereto. In addition, although an ink jet recording head was described as an example of a liquid ejecting head, it is naturally possible to apply the invention to a liquid ejecting head that ejects liquids other than ink. Examples of a liquid ejecting head for ejecting liquid other than ink include a color material ejecting head used for manufacturing a color filter of a liquid crystal display or the like, an electrode material ejecting head used for electrode formation such as an organic EL display or a field emission display (FED), a bioorganic material ejecting head used for manufacturing a biochip, and the like.

Since the piezoelectric element and the piezoelectric element application device of the invention have high piezoelectric characteristics, the piezoelectric element and the piezoelectric element application device are suitable for a piezoelectric actuator. Specific piezoelectric actuators include, for example, an ultrasonic motor, a vibrating dust-removing apparatus, a piezoelectric transformer, a piezoelectric speaker, a piezoelectric pump, a temperature-electric converter, a pressure-electric converter, and the like.

Since the piezoelectric element and the piezoelectric element application device of the invention have a high piezoelectric performance, it is possible to suitably use the piezoelectric element and the piezoelectric element application device for a piezoelectric sensor element. Specific examples of the sensor element include an ultrasonic detector (ultrasonic sensor), an angular velocity sensor, an acceleration sensor (gyro sensor), a vibration sensor, an inclination sensor, a pressure sensor, a collision sensor, a human sensor, an infrared sensor, a terahertz sensor, thermal detection sensors (thermal sensors), pyroelectric sensors, piezoelectric sensors, and the like. In addition, the piezoelectric element and the piezoelectric element application device may be applied to a filter such as a harmful light blocking filter such as infrared rays, an optical filter using a photonic crystal effect by forming a quantum dot, an optical filter using a light interference of a thin film, and the like.

It is also possible to form an ultrasonic measuring apparatus in which an ultrasonic sensor is mounted, for example, by providing the piezoelectric element of the invention and a control means measuring a detection target using signals based on at least one of ultrasonic waves transmitted by the piezoelectric element of the invention and ultrasonic waves received by the piezoelectric element of the invention. Such an ultrasonic measuring apparatus obtains information relating to the position, shape, and speed of the measurement object based on the time from when the ultrasonic wave is transmitted to a time point at which the transmitted ultrasonic wave is reflected by the object to be measured and the echo signal is received, and the piezoelectric element may be used as an element for generating ultrasonic waves or an element for detecting an echo signal. With such an ultrasonic wave generating element and an echo signal detecting element, it is possible to provide an ultrasonic measuring apparatus having excellent displacement characteristics.

Since the piezoelectric element and the piezoelectric element application device of the invention have high ferroelectricity, it is possible to suitably use the piezoelectric element and the piezoelectric element application device for a ferroelectric element. Specific examples of ferroelectric elements include a ferroelectric memory (FeRAM), a ferroelectric transistor (FeFET), a ferroelectric operation circuit (FeLogic), a ferroelectric capacitor, and the like.

Since it is possible for the piezoelectric element and the piezoelectric element application device of the invention to control the domain regions using voltage, it is possible to suitably use the piezoelectric element and the piezoelectric element application device for a voltage control type optical element. Specific examples of the optical element include a wavelength converter, an optical waveguide, an optical path modulator, a refractive index control element, an electronic shutter mechanism, and the like.

Since the piezoelectric element and the piezoelectric element application device of the invention exhibit good pyroelectric characteristics, it is possible to suitably use the piezoelectric element and the piezoelectric element application device as a pyroelectric element and application to a robot or the like utilizing the various motors described above as a driving source is also possible.

What is claimed is:

1. A piezoelectric element comprising:
a first electrode;
a second electrode; and
a piezoelectric layer arranged between the first electrode and the second electrode,
wherein the piezoelectric layer is a thin film that includes a perovskite-type composite oxide which includes potassium, sodium, and niobium and which is preferentially oriented in a (100) plane,
a crystal structure of the perovskite-type composite oxide includes a basic lattice structure having an oxygen octahedron and a super lattice structure in which the oxygen octahedron is tilted, and
the oxygen octahedron of the super lattice structure is inclined such that a period of the super lattice structure is twice a period of the basic lattice structure.

2. The piezoelectric element according to claim 1, wherein the piezoelectric layer is formed by interspersing regions formed of a super lattice structure in which the oxygen octahedron is tilted in a crystal structure of the perovskite-type composite oxide.

3. A piezoelectric element application device comprising: the piezoelectric element according to claim 1.

4. A piezoelectric element application device comprising: the piezoelectric element according to claim 2.

* * * * *